United States Patent
Jackson et al.

(10) Patent No.: US 9,496,947 B1
(45) Date of Patent: Nov. 15, 2016

(54) SWITCHABLE LINEAR AND SATURATED VERY SMALL APERTURE TERMINAL (VSAT) MODEM

(71) Applicants: Thomas Jackson, Gaithersburg, MD (US); George Eapen, Clarksburg, MD (US)

(72) Inventors: Thomas Jackson, Gaithersburg, MD (US); George Eapen, Clarksburg, MD (US)

(73) Assignee: Hughes Network Systems L.L.C., Germantown, MD (US)

( * ) Notice: Subject to any disclaimer, the term of this patent is extended or adjusted under 35 U.S.C. 154(b) by 0 days.

(21) Appl. No.: 14/806,088

(22) Filed: Jul. 22, 2015

(51) Int. Cl.
*H04B 1/38* (2015.01)
*H04B 7/185* (2006.01)
*H04L 5/00* (2006.01)

(52) U.S. Cl.
CPC ...... *H04B 7/18528* (2013.01); *H04B 7/18517* (2013.01); *H04L 5/0048* (2013.01)

(58) Field of Classification Search
CPC .............. H04M 11/06; H04M 11/062; H04L 25/4927; H04L 5/1438; H04L 27/2608; H04L 27/2601; H04L 1/0025; H04L 1/0003; H04L 1/0071; H04L 5/0007; H04L 1/0009; H04L 27/0008; H04B 1/40; H04B 3/23; H04B 1/403
USPC .................................. 375/222, 219, 316, 295
See application file for complete search history.

(56) References Cited

U.S. PATENT DOCUMENTS

| | | | | |
|---|---|---|---|---|
| 6,075,996 A * | 6/2000 | Srinivas | ................. | H04B 1/005 455/180.1 |
| 6,396,355 B1 * | 5/2002 | Rezin | ..................... | H03L 7/189 327/156 |
| 2004/0229562 A1 * | 11/2004 | Wren | ................. | H04B 7/18563 455/3.02 |
| 2006/0089115 A1 * | 4/2006 | Goodman | ............. | H04B 1/005 455/189.1 |

* cited by examiner

*Primary Examiner* — Zewdu Kassa
(74) *Attorney, Agent, or Firm* — Capitol City TechLaw; Jasbir Singh

(57) ABSTRACT

A modem to interface with a constant envelope saturated and/or linear radio, the modem including: a synthesizer modulator configured to generate a reference signal; a prescaler configured to reduce the reference signal to a lower frequency signal; a switch configured to enable the prescaler; and an output configured to output the reference signal when the prescaler is disabled, and configured to output the lower frequency signal as the reference signal when the prescaler is enabled.

18 Claims, 2 Drawing Sheets

“SWITCHABLE LINEAR AND SATURATED
VERY SMALL APERTURE TERMINAL
(VSAT) MODEM”

FIELD

The present disclosure relates to an apparatus and system architecture that provides a low cost Very Small Aperture Terminal (VSAT) modem to interface with saturated and linear outdoor radios. In particular, the apparatus and system are useful for a VSAT product and any other radio application where linear as well as constant envelope saturated modulation needs to be supported.

BACKGROUND

In a typical Very Small Aperture Terminal (VSAT) system a modem gets connected to outdoor radio equipment using an inter facility link (IFL). The outdoor radio equipment outdoor unit includes a Block Up-Converter (BUC) and a power amplifier. Satellite modems are typically connected to the BUC. There are two modes of transmission to the satellite, namely, a linear mode and a constant envelope saturated mode, each requiring a different VSAT modem. The typical linear modem transmits information via an IFL to a linear BUC using a signal ranging from 950 MHz to 1700 MHz. The typical constant envelope saturated modem transmits information to a saturated Phase Lock Loop (PLL) based up-converter using a signal ranging from 228-234 MHz via an IFL. In order to support both a BUC and PLL based multiplying converter, the industry uses two different satellite modems, one having a linear transmitter and the other having a saturated transmitter. Moreover, the two modems require installation and configuration of a second IFL.

As such, there is a need to provide to a satellite modem that is switchable between saturated and linear BUC modes, and preferably uses a single IFL to provide such functionality.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

A modem to interface with a saturated and/or linear radio is provided. The modem including: a synthesizer modulator configured to generate a reference signal; a prescaler configured to reduce the reference signal to a lower frequency signal; a switch configured to enable the prescaler; and an output configured to output the reference signal when the prescaler is disabled, and configured to output the lower frequency signal as the reference signal when the prescaler is enabled.

A satellite modem to generate a saturated and/or linear radio signal is provided. The modem including: a signal to indicate generation of a saturated radio reference signal or a linear radio reference signal; a synthesizer modulator configured to generate a reference signal; a prescaler configured to reduce the reference signal to generate the saturated radio reference signal when the signal indicates generation of the saturated radio reference signal; and an output configured to output the saturated radio reference signal when the signal indicates generation of the saturated radio reference signal, and configured to output the reference signal as the linear radio reference signal when the signal indicates generation of the linear radio reference signal.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not therefore to be considered to be limiting of its scope, implementations will be described and explained with additional specificity and detail through the use of the accompanying drawings.

DETAILED DESCRIPTION

Embodiments are discussed in detail below. While specific implementations are discussed, it should be understood that this is done for illustration purposes only. A person skilled in the relevant art will recognize that other components and configurations may be used without parting from the spirit and scope of the subject matter of this disclosure.

The terminology used herein is for describing particular embodiments only and is not intended to be limiting of the present disclosure. As used herein, the singular forms "a," "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first," "second," and the like does not imply any particular order, but they are included to either identify individual elements or to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

Overview

Figure 1:
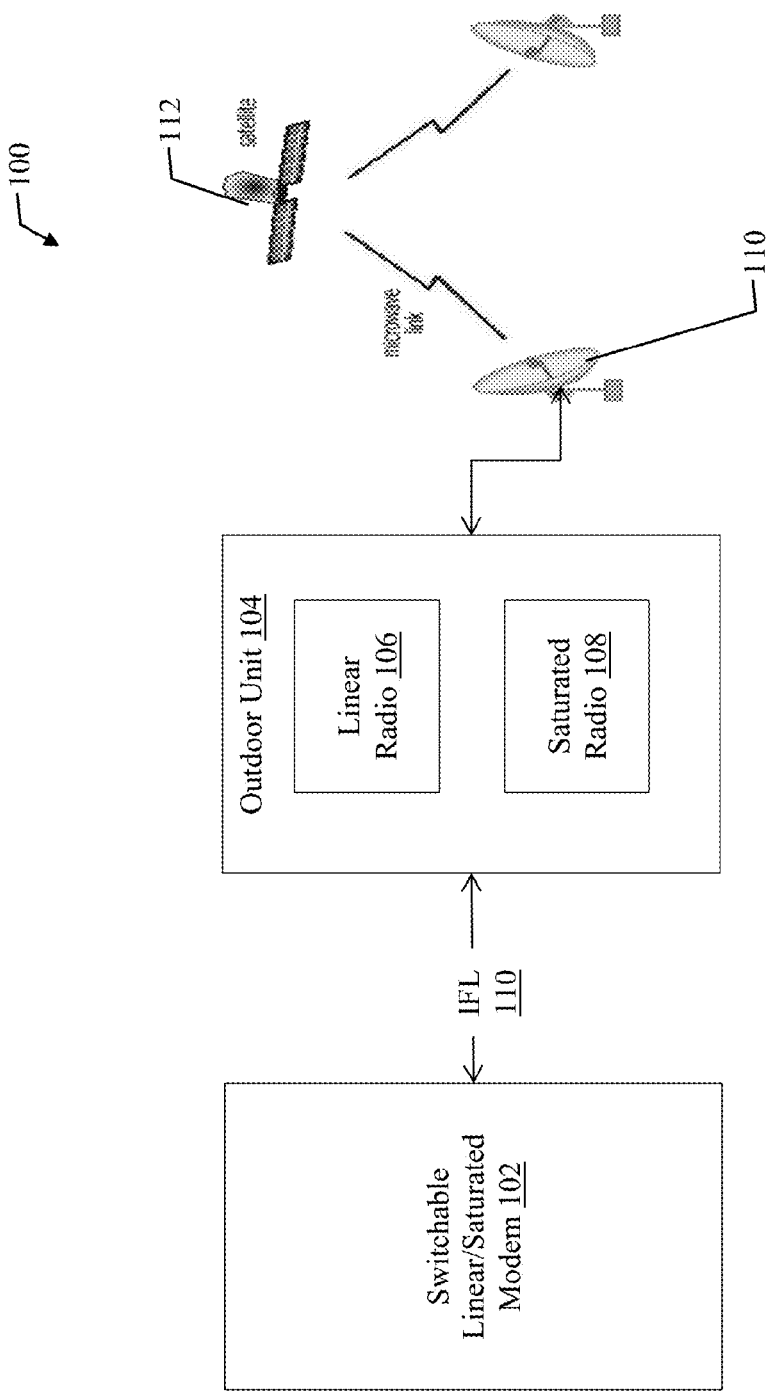
FIG. 1 illustrates a communication system including a switchable saturated and linear mode satellite modem, according to various embodiments.

FIG. 1 illustrates a communication system including a switchable saturated and linear mode satellite modem, according to various embodiments.

According to various embodiments, a communication systems 100 includes a switchable saturated and linear mode satellite modem 102 that may be connected to an outdoor unit 110 via an inter facility link (IFL) 104. The switchable saturated and linear mode satellite modem 102 may be referred to as a VSAT modem 102. The outdoor unit 104 communicates with a satellite 112 via an antenna 110.

In some embodiments, the VSAT modem 102 connects to a linear radio 106 in the outdoor unit 104. The VSAT modem 102 may include a block upconverter (BUC) and a power amplifier to communicate with/via the linear radio 106. In some embodiments, the VSAT modem connects to a saturated radio 108 in the outdoor unit 104. The VSAT modem 102 may include a saturated PLL based multiplying upconverter with the power amplifier to communicate with/via the saturated radio 108. In order to support both a BUC and PLL based multiplying converter the VSAT modem 102 may include a switchable linear and saturated reference signal generator that may be connected with a transmitter in the outdoor unit 104.

In linear mode, the VSAT modem 102 transmits information to a linear BUC using a signal ranging, for example, from 950 MHz to 1700 MHz. In saturated mode, the VSAT modem 102 transmits information to a saturated Phase Lock Loop (PLL) based upconverter using a signal ranging from, for example, 228 MHz to 234 MHz. in exemplary embodiments, the VSAT modem 102 provides or generates a reference signal having an integrated phase noise of, for example, less than or equal to 0.25 degree Root Mean Square (RMS).

In exemplary embodiments, the outdoor unit 104 may only include the linear radio 106, and the VSAT modem 102 may operate in linear radio mode only. In exemplary embodiments, the outdoor unit 104 may only include a saturated radio 108, and the VSAT modem 102 may operate in saturated radio mode only. In exemplary embodiments, the outdoor unit 104 may include both the linear radio 106 and the saturated radio 108, and the VSAT modem 102 may dynamically switch operation between the linear radio mode and the saturated radio mode as desired. The VSAT modem 102 may switch between the linear radio mode and the saturated radio mode, for example, in response to a signal, the operation mode of the VSAT modem 102, a threshold frequency, or the like.

In exemplary embodiments, a synthesizer modulator chip generates frequencies ranged around a 1.8 GHz modulated carrier when a saturated PLL based upconverter is used. The modulated signal is divided down to a lower reference frequency, for example, approximately 230 MHz (REF), approximately 110 MHz (REF), or the like, by the prescaler. The prescaler may divide the modulated signal by, for example, four (4), eight (8), sixteen (16), or the like, to provide the modulated signal at a lower reference frequency. The prescaler output is fed into the diplexer and send out to the IFL as the transmit signal for the saturated PLL based up-converter. In exemplary embodiments, the satellite modem uses an electronic switch to support both a saturated and linear upconverter communications between an indoor unit and an outdoor unit. As such, the satellite modem provides: an approximately 230 MHz transmit carrier for saturated PLL (spectrum plot) before the upconverter and after, and an L-band transmit carrier for linear upconverter (spectrum plot) before the upconverter and after. In exemplary embodiments, the indoor facility houses a computer, server, router or the like. In exemplary embodiments, the outdoor facility houses a radio transceiver and an antenna.

The apparatus allows the use of a single VSAT modem to interface with saturated and linear outdoor radios with a simplified transmit architecture. The simplified transmit architecture leads to a low cost modem and a lower cost installation. The apparatus may be used for a VSAT product and any other radio application where linear as well as constant envelope modulation needs to be supported. When both a saturated and linear radio is required, both types of radios can be supported using a single IFL.

Figure 2:
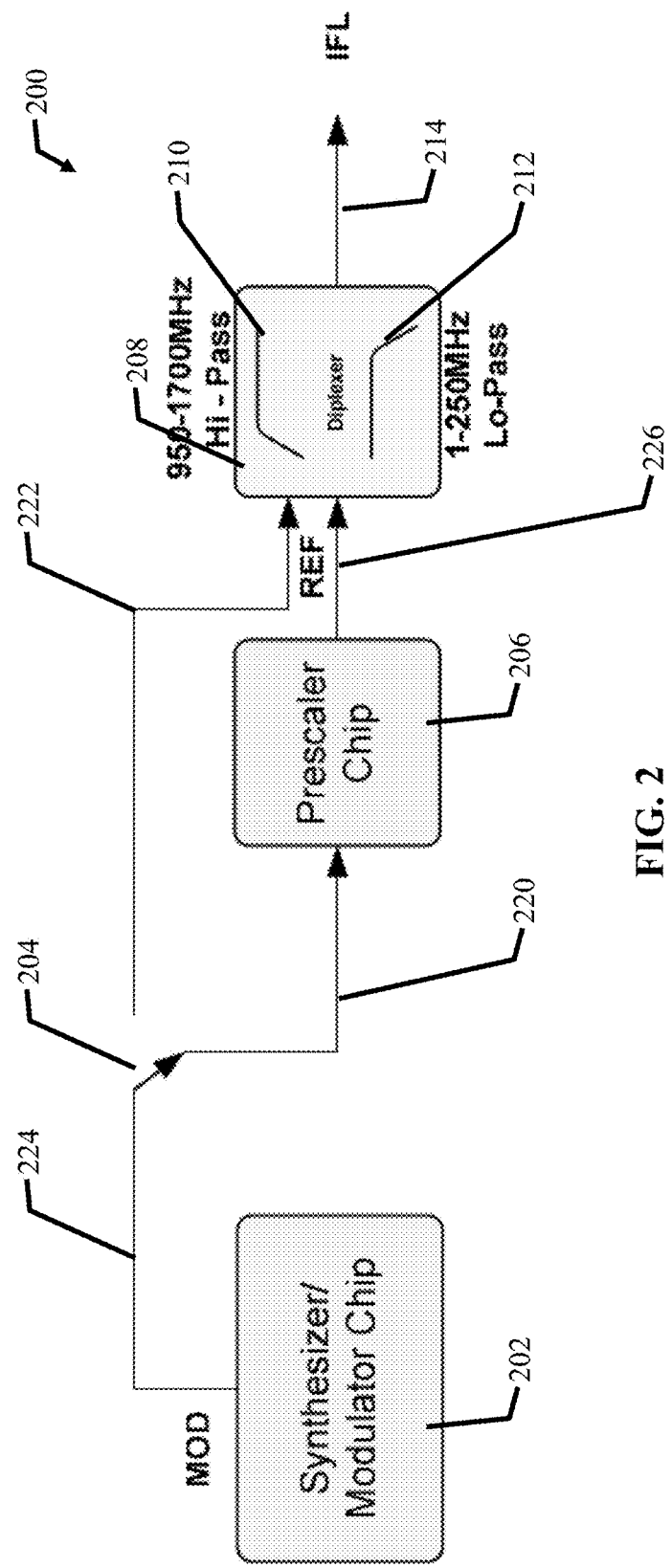
FIG. 2 illustrates a functional diagram for an apparatus for generation of transmit frequencies used for saturated and linear BUC mode in a satellite modem, according to various embodiments.

FIG. 2 illustrates an apparatus for generation of transmit frequencies used for saturated and linear BUC mode in a satellite modem, according to various embodiments.

An apparatus 200 may include a synthesizer modulator chip 202, a switch 204, a prescaler 206, a hi-pass filter 210, and a lo-pass filter 212. In exemplary embodiments. A diplexer 208 may include the hi-pass filter 210 and the lo-pass filter 212. The apparatus may include a connector (not shown) to link to a remote apparatus, for example, with an inter-facility link (IFL). According to various embodiments, the apparatus 200 may be used in a satellite modem, a VSAT satellite modem, or the like. In some embodiments, when the local oscillator frequency generated by the chip 202 is less than 1.7 GHz, the apparatus 200 may be linked to a linear up-converter via an Inter-Facility Link (IFL) to transmit a transmit signal 214. In some embodiments, when the local oscillator frequency generated by the chip 202 ranges from 1700 MHz to 1872 MHz, the apparatus 200 may be linked to a saturated PLL based upconverter via the IFL to transmit the transmit signal 214.

The synthesizer modulator chip 202 generates a reference signal 224. In some embodiments, the chip 202 generates the reference signal 224 by generating a local oscillator frequency that is used as a carrier. The reference signal may be modulated according to a modulation scheme by the chip 202. According to various embodiments, the reference signal 224 may have a carrier frequency selected between, for example, 500 MHz to 2500 MHz, 800 MHz to 2000 MHz, 950 MHz to 1872 MHz, or the like.

The switch 204 may be an electronic switch. The switch 204 may be switchable based on a signal (not shown) to indicate generation of a saturated radio reference signal 222 based on the reference signal 224 or a linear radio reference signal 220 based on the reference signal 224. In some embodiments, the switch 204 may enable or disable the prescaler 206. In some embodiments, the switch 204 may be set such that the reference signal 224 bypasses the prescaler 206.

In some embodiments, the switch 204 may be an electronic switch. The switch 204 may be switchable by a hard-wired switch, for example, a dip-switch or the like. In some embodiments, the switch 204 may be software switchable electronic switch, for example, with a Central Processing Unit (CPU) (not shown) that may set the switch 204 using techniques well known in the art, for example, by setting a register, by communicating a command or the like. The switch 204 may be settable by a gateway from a central office or a VSAT communicating with the CPU.

In some embodiments, the switch 204 may be switchable by a carrier frequency of a signal (for example, a modulated signal) generated by the chip 202, for example, the switch 204 may be set to send the signal to the prescaler 206 when the carrier frequency is greater than 1700 MHz, the switch 204 may be set to bypass the prescaler 206 when the carrier frequency is less than or equal to 1700 MHz, or the like.

When the switch 204 is set to not use the prescaler 206, the switch 204 passes the reference signal 224 from the synthesizer modulator chip 202 to the high pass filter 210. The switch 204 may be set to not use the prescaler 206, for example, when the carrier frequency of the reference signal 224 is between a desired range (such as, 1 MHz to 1700 MHz, 950 MHz to 1700 MHz, or the like), is less than or equal to a threshold frequency (such as, 1700 MHz, 1750 MHz, 1800 MHz, or the like), or the like. When the prescaler 206 is not used, the reference signal 224 is filtered by the hi-pass filter 210 to become the basis of the transmit signal 214 transmitted to the linear up-converter (not shown). The transmit signal 214 may be transmitted via the IFL to the linear up-converter (not shown).

When the switch 204 is set to use the prescaler 206, the switch 204 passes the reference signal 224 from the synthesizer modulator chip 202 to the prescaler 206. The switch 204 may be set to send the reference signal 224 to the prescaler 206, for example, when the carrier frequency of the reference signal 224 is between a desired range (such as, 1750 MHz to 2000 MHz, between 1750 MHz and 1900 MHz, between 1824 MHz and 1872 MHz, or the like), is greater than a threshold frequency (such as, 1700 MHz, 1750 MHz, 1800 MHz, or the like), or the like. When the reference signal 224 is passed to the prescaler 206, the reference signal 224 is used to generate a low frequency signal 220 that is filtered by the lo-pass filter 212 to become the basis of the transmit signal 214 transmitted to the linear up-converter (not shown). The transmit signal 214 may be transmitted via the IFL to the linear up-converter (not shown).

In exemplary embodiments, the prescaler 206 may reduce the reference signal by integer dividing the reference signal, for example, by four (4), by eight (8), by sixteen (16) or the like. In some embodiments, when the prescaler divides by eight (8), the lower frequency signal range may include a signal from 228 MHz to 234 MHz. In some embodiments, when the prescaler divides by sixteen (16), the lower frequency signal range may include a signal from 107 MHz to 113 MHz.

The diplexer 208 may include the hi-pass filter 210 and the lo-pass filter 212. In exemplary embodiments, the hi-pass filter 210 may pass frequencies between 950 MHz to 1700 MHz. In exemplary embodiments, the lo-pass filter 212 may pass frequencies between 1 MHz to 250 MHz.

A very small aperture terminal (VSAT) is a two-way satellite ground station or a stabilized maritime VSAT antenna with a dish antenna that is smaller than 3 meters. The parabolic shape of the dish has special reflective properties that enable it to concentrate and focus signals to a single point, i.e., the focal point. The dish receives and transmits signals, after reflecting and concentrating them, from and to satellites.

VSATs may be used to transmit narrowband data (point of sale transactions, such as, credit card, polling or RFID data; or SCADA), or broadband data (for the provision of Satellite Internet access to remote locations, VoIP or video). VSATs may be also used for transportable, on-the-move (utilizing phased array antennas) or mobile maritime communications. Very Small Aperture Terminal (VSAT) remote terminals may be used to communicate data, voice and video, to or from a remote site or location a satellite hub. The satellite hub provides a hub terminal including an outdoor transceiver and antenna, indoor integrated modem and multiplexing systems, a single-cable inter-facility link, and a variety of network interfaces that may simultaneously deliver traffic to a network backbone, for example, in TDM, ATM, and IP formats. Sectors may be provisioned for 1:N (e.g., N=4) active redundancy.

Although the subject matter has been described in language specific to structural features and/or methodological acts, it is to be understood that the subject matter in the appended claims is not necessarily limited to the specific features or acts described above. Rather, the specific features and acts described above are disclosed as example forms for implementing the claims.

Although the above descriptions may contain specific details, they should not be construed as limiting the claims in any way. Other configurations of the described embodiments are part of the scope of this disclosure. Further, implementations consistent with the subject matter of this disclosure may have more or fewer acts than as described, or may implement acts in a different order than as shown. Accordingly, the appended claims and their legal equivalents should only define the invention, rather than any specific examples given.

We claim as our invention:

1. A modem to interface with a constant envelope saturated and/or linear radio, the modem comprising:
   a synthesizer modulator configured to generate a reference signal;
   a prescaler configured to reduce the reference signal to a lower frequency signal;
   a switch configured to enable the prescaler;
   an output configured to output the reference signal when the prescaler is disabled, and configured to output the lower frequency signal as the reference signal when the prescaler is enabled; and
   a diplexer comprising a high pass filter and a low pass filter, wherein the reference signal is passed through the low pass filter when the prescaler is enabled and the reference signal is passed through the high pass filter when the prescaler is disabled.

2. The modem of claim 1, wherein the output is connected to the saturated radio when the prescaler is enabled, and the output is connected to the linear radio when the prescaler is disabled.

3. The modem of claim 1, further comprising:
   an Inter-Facility Link (IFL); and
   an outdoor unit comprising the saturated and/or linear radio,
   wherein the IFL connects the output of the modem to the outdoor unit.

4. The modem of claim 1, wherein the frequency of the reference signal ranges between 950 MHz to 1872 MHz.

5. The modem of claim 1, wherein the prescaler reduces the reference signal by integer dividing the reference signal by eight (8).

6. The modem of claim 1, wherein the reference signal generated by the synthesizer modulator has an integrated phase noise of less than or equal to 0.25 degree Root Mean Square (RMS).

7. The modem of claim 1, wherein the frequency of the reference signal ranges between 950 MHz to 1872 MHz, the prescaler reduces the reference signal by integer dividing the reference signal by eight (8), the lower frequency signal ranges from 228 MHz to 234 MHz, and the reference signal generated by the synthesizer modulator has an integrated phase noise of less than or equal to 0.25 degree RMS.

8. The modem of claim 1, wherein the switch enables the prescaler when a carrier frequency of the reference signal is greater than or equal to a threshold frequency, and the switch disables the prescaler when the carrier frequency of the reference signal is less than the threshold frequency.

9. The modem of claim 8, wherein the threshold frequency is approximately 1750 MHz.

10. A satellite modem to generate a constant envelope saturated and/or linear radio signal, the modem comprising:
    a signal to indicate generation of a constant envelope saturated radio reference signal or a linear radio reference signal;
    a synthesizer modulator configured to generate a reference signal;

a prescaler configured to reduce the reference signal to generate the saturated radio reference signal when the signal indicates generation of the constant envelope saturated radio reference signal;

an output configured to output the constant envelope saturated radio reference signal when the signal indicates generation of the saturated radio reference signal, and configured to output the reference signal as the linear radio reference signal when the signal indicates generation of the linear radio reference signal; and a diplexer comprising a high pass filter and a low pass filter, wherein the constant envelope saturated radio reference signal is passed through the low pass filter and the linear radio reference signal reference signal is passed through the high pass filter.

11. The modem of claim 10, further comprising an electronic switch to receive the signal, wherein the electronic switch disables the prescaler when the signal indicates generation of the linear radio reference signal.

12. The modem of claim 10, further comprising an electronic switch to receive the signal, wherein the electronic switch enables the prescaler when the signal indicates generation of the constant envelope saturated radio reference signal.

13. The modem of claim 10, wherein the frequency of the reference signal ranges between 950 MHz to 2000 MHz.

14. The modem of claim 10, wherein the signal is generated by a Central Processing Unit (CPU).

15. The modem of claim 10, wherein the prescaler reduces the reference signal by integer dividing the reference signal by eight (8).

16. The modem of claim 10, wherein the frequency of the reference signal ranges between 950 MHz to 2000 MHz, the prescaler reduces the reference signal by integer dividing the reference signal by eight (8), the constant envelope saturated radio frequency signal ranges from 228 MHz to 234 MHz, and the reference signal generated by the synthesizer modulator has an integrated phase noise of less than or equal to 0.25 degree RMS.

17. The modem of claim 10, wherein the reference signal generated by the synthesizer modulator has an integrated phase noise of less than or equal to 0.25 degree RMS.

18. The modem of claim 10, an Inter-Facility Link (IFL); and an outdoor unit comprising the constant envelope saturated and/or linear radio, wherein the IFL connects the output of the modem to the outdoor unit.

* * * * *